United States Patent
Posseme

(10) Patent No.: US 9,805,948 B2
(45) Date of Patent: Oct. 31, 2017

(54) SELECTIVE ETCHING PROCESS OF A MASK DISPOSED ON A SILICON SUBSTRATE

(71) Applicant: COMMISSARIAT A L'ENERGIE ATOMIQUE ET AUX ENERGIES ALTERNATIVES, Paris (FR)

(72) Inventor: Nicolas Posseme, Grenoble (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/030,459

(22) PCT Filed: Nov. 19, 2014

(86) PCT No.: PCT/FR2014/052965
§ 371 (c)(1),
(2) Date: Apr. 19, 2016

(87) PCT Pub. No.: WO2015/075380
PCT Pub. Date: May 28, 2015

(65) Prior Publication Data
US 2016/0254165 A1  Sep. 1, 2016

(30) Foreign Application Priority Data

Nov. 20, 2013  (FR) ..................... 13 61394

(51) Int. Cl.
*H01L 21/31* (2006.01)
*H01L 21/311* (2006.01)
(Continued)

(52) U.S. Cl.
CPC ...... *H01L 21/31144* (2013.01); *H01L 21/266* (2013.01); *H01L 21/26513* (2013.01);
(Continued)

(58) Field of Classification Search
CPC ............ H01L 21/26513; H01L 21/266; H01L 21/31138
See application file for complete search history.

(56) References Cited

U.S. PATENT DOCUMENTS

2007/0243700 A1   10/2007  Qin et al.
2009/0035584 A1*   2/2009  Tran ................... H01L 21/0337
                                                                    428/446
(Continued)

OTHER PUBLICATIONS

Feb. 24, 2015 Search Report issued in International Patent Application No. PCT/FR2014/052965.

*Primary Examiner* — Caridad Everhart
*Assistant Examiner* — Ankush Singal
(74) *Attorney, Agent, or Firm* — Oliff PLC

(57) ABSTRACT

The method includes the steps of: a) providing a silicon substrate including a first portion covered by the mask made from a carbonaceous material and a second doped portion, the mask including, at the surface, a surface layer including implanted ionic species and an underlying layer free of implanted ionic species, b) exposing the surface layer and the second portion to a $SiCl_4$ and $Cl_2$ plasma so as to deposit a silicon chloride $SiCl_x$ layer on the second portion and etch the surface layer, c) etching the underlying layer so as to expose the first portion, and d) etching the silicon chloride $SiCl_x$ layer so as to expose the second portion.

12 Claims, 2 Drawing Sheets

(51) Int. Cl.
*H01L 21/8238* (2006.01)
*H01L 21/265* (2006.01)
*H01L 21/266* (2006.01)

(52) U.S. Cl.
CPC .................. *H01L 21/31138* (2013.01); *H01L 21/823814* (2013.01); *H01L 21/823828* (2013.01)

(56) References Cited

U.S. PATENT DOCUMENTS

2012/0156849 A1* 6/2012 Yu ..................... H01L 21/76838
 438/381
2016/0020152 A1* 1/2016 Posseme ........... H01L 21/31138
 438/696

* cited by examiner

SELECTIVE ETCHING PROCESS OF A MASK DISPOSED ON A SILICON SUBSTRATE

TECHNICAL FIELD

The present invention concerns a selective etching process of a mask deposited on a substrate.

BACKGROUND

When manufacturing integrated circuits on a substrate for example silicon substrate, an implantation step of ionic species is required to locally dope the substrate and to allow carrying out N or P transistors. Prior to this implantation, the zones of the substrate which must not be implanted are protected by forming a mask generally formed of resin. After N- or P-type implantation for carrying out transistors, the top of the resin protecting the non-implanted zones is implanted at the same time. In order to finish the manufacture of the devices, it is then necessary to remove the mask. However, the traditional removal step of a resin by dry or wet method is not effective when the resin has been implanted beforehand. The implanted mask forms, indeed, a surface crust which is very difficult to be accurately removed and under conditions which do not damage the areas of the substrate not covered by the mask. It is then known to proceed to the removal of the mask in two steps. The first step consists in removing the surface crust, and then the second step consists in removing the underlying non-implanted resin. However, the first step requires the use of an aggressive etching chemistry which may damage and consume the silicon of the substrate in particular at the implanted source and drain, thereby degrading the performances of the devices.

A solution described by Kurt K. Christenson et al. in the publication 'All Wet stripping Of Implanted Photoresist", 8th International Symposium on Ultra Clean Processing of Semiconductor Surfaces UCPSS, 2006, uses a chemical solution called Piranha comprising a mixture of $H_2SO_4$ and $H_2O_2$. The drawbacks of this method lie in that said chemical solution shows a relatively slow reactivity with respect to the implanted resin and in that its reactivity towards the oxide $SiO_2$ suggests a significant risk of damage of a silicon substrate.

An alternative to this method consists in performing a dry etching comprising a step of $CF_4/O_2$ plasma etching followed by a step of $N_2/O_2$ plasma etching generated by microwave at high temperature. Herein again, the damaging of the silicon substrate not covered by the mask during the first etching is such that it is not possible to accurately control the damaging of the N and P doped silicon zones.

SUMMARY

The present invention aims to overcome these drawbacks and provides, to this end, a selective etching process of a carbon material mask disposed on a silicon substrate, characterized in that it comprises the steps consisting of:

a) Providing a silicon substrate including a first portion covered by the carbon material mask and a second doped portion, the mask including on surface a surface layer comprising implanted ionic species and an underlying layer free of implanted ionic species, b) Exposing the surface layer and the second portion to a $SiCl_4$ and $Cl_2$ plasma so as to deposit a chloride silicon $SiCl_x$ layer on the second portion and to etch the surface layer, c) Etch the underlying layer so as to expose the first portion, and d) Etch the silicon chloride $SiCl_x$ layer, so as to expose the second portion.

This process thus allows selectively removing the mask in a controlled manner, without damaging the silicon substrate, in particular its doped zones. Indeed, the etching of the implanted surface layer of the mask is carried out at the same time as the silicon chloride $SiCl_x$ layer is deposited on the silicon substrate, in particular due to a plasma combining $SiCl_4$ and $Cl_2$. This silicon chloride $SiCl_x$ layer ensures the function of protective layer of the silicon substrate. Once the implanted surface layer is removed, the removal of the underlying layer of the mask may be performed by an etching which attacks more quickly the underlying layer than the silicon chloride $SiCl_x$ layer protecting the silicon substrate. It is then possible to remove the entire mask before the protective silicon chloride $SiCl_x$ layer disappears. Then, this silicon chloride $SiCl_x$ layer is selectively removed with respect to the silicon substrate so as to finish the manufacture of the components.

It is understood, in the present document that the first portion of the substrate is not necessarily continuous, but that it may be discontinuous and distributed over the entire substrate. It is the same for the second portion of the substrate.

Furthermore, the second portion of the silicon substrate may comprise manufacturing precursors of electronic devices.

It is further understood that step b) in the present document allows removing at least partially the surface layer.

According to one possibility, step b) is carried out at a temperature comprised between 20 and 120° C. and preferably around 60° C.

Typically, the carbon material mask consists of a carbon resin, such as epoxy resin, or of SoC (acronym Spin on Carbon) and the silicon substrate is constituted of silicon, silicon nitride, silicon oxide, SiC, SiGe or any other material including silicon. Such a mask is indeed inexpensive. It is also easy to be formed by depositing a carbon material layer, then by forming patterns exposing the second portion of the silicon substrate allowing a local doping by implantation of ionic species.

According to one possibility, step b) consists in partially etching the surface layer and the process comprises between step b) and step c) a step b1) consisting in fluorine plasma etching the portion of the residual surface layer, in particular by $CF_4$ or $SF_6$ plasma. In other words, step b) comprises a step b1) carried out after the partial etching of the surface layer. The underlying layer of the mask is then exposed at the end of step b1) and step c) may be carried out.

Indeed, once obtained by deposition at step b), the thickness of the silicon chloride $SiCl_x$ layer required to protect the silicon substrate during all subsequent etching steps of the mask, it is possible to modify the etching conditions of the surface layer. The fluorine plasma allows in particular accelerating the etching of the implanted surface layer while initiating the removal of a portion of the silicon chloride $SiCl_x$ layer but with a high etching selectivity.

According to one possibility, the fluorine plasma etching of step b1) further comprises oxygen. It is noted that under these conditions of exposure to oxygen, the silicon chloride SiClx spontaneously oxidizes, at least on a few nanometers of the protective layer, in particular to $SiO_zCl_y$ with y<x. After the total removal of the surface layer, the etching step c) of the underlying layer may be then carried out.

Advantageously, the used plasma at step b) is obtained by a SiCl$_4$ flow rate comprised between 20 and 200 cm$^3$/min, preferably comprised between 80 cm$^3$/min and 120 cm$^3$/min and a Cl$_2$ flow rate lower than 20 cm$^3$/min, preferably comprised between 5 and 15 cm$^3$/min. These conditions indeed allow the etching of the surface layer while promoting the deposition of the silicon chloride SiCl$_x$ layer and avoiding an etching of the silicon of the silicon substrate.

When the silicon substrate is based on silicon, the mask, based on carbon resin, and the ionic species, derivatives of arsenic, are implanted at 60 nm deep in the resin, the SiCl$_4$ flow rate is preferably about 95 cm$^3$/min and the Cl$_2$ flow rate is preferably about 10 cm$^3$/min.

Preferably, the plasma used at step b) is obtained in an etching reactor configured to provide a power lower than 300 W. Hereafter, the deposition of the silicon chloride layer also takes place on the surface layer of the mask.

More preferably and in the case of a carbon resin, the power used for the source of the etching reactor is lower than about 250 W.

Optimally, step b) is carried out in an etching reactor configured to apply to the silicon substrate a bias voltage comprised between 100 and 200 V and preferably a bias voltage comprised between 120 V and 150 V. These conditions optimally control the ion energy so as to promote the deposition of the silicon chloride layer and to accelerate the etching of the surface layer.

More preferably for the example mentioned hereinabove, the bias voltage is about 130 V.

Typically, the etching reactor is configured to apply to the silicon substrate a pulsed bias voltage with a frequency comprised between 100 Hz and 5 kHz and a duty cycle comprised between 20 and 90%. These conditions improve the selectivity of the etching compared with the application of a direct bias voltage.

According to one disposition, step c) is carried out by a mixture of nitrogen and hydrogen plasma, in particular by plasma generated with a frequency selected from the microwaves. These etching conditions allow a very good etching selectivity of the underlying layer vis-à-vis the deposited silicon chloride layer. It is further observed that during the displacement of the substrate in the microwave reactor and that the substrate is exposed to air, oxygen in the air spontaneously oxidizes the silicon chloride, in particular on a small thickness of the layer.

According to one possibility, step d) is carried out by wet method, in particular with a HF dilute solution. This etching allows effectively removing the silicon chloride without damaging or consuming the silicon substrate. It is also likely that this step spontaneously oxidizes a part of the silicon chloride which is then etched as the non-oxidized silicon chloride.

Advantageously, steps b), c) and/or b1) are carried out in the same enclosure of an etching reactor, the etching reactor being an etching reactor of the capacitively or inductively coupled plasma type. It is thus not necessary to displace the substrate from one reactor to another to carry out the selective removal of the mask, thereby advantageously limiting the risks of damage of the substrate.

According to one disposition, step a) comprises beforehand a first step a1) consisting in forming the mask on the first portion of the silicon substrate and then a step a2) consisting in implanting ionic species in the second portion of the silicon substrate and in the mask so as to form the surface layer.

The implantation step of the ionic species allows doping the second portion of the substrate which was not covered by the mask, so as to form in particular N and P transistors therein. The mask covering the first portion receives the implanted ionic species instead of the first portion of the substrate which remains free of the implanted ionic species. The electrical properties of the first portion of the substrate then remain unchanged.

Other aspects, objects and advantages of the present invention will appear on reading the following description of an embodiment thereof, given by way of non-limiting example and with reference to the appended drawings. The figures are not necessarily to scale all elements shown so as to improve their readability. Furthermore, the embodiment is illustrated related to the manufacture of transistors. In the rest of the description, for the sake of simplicity, identical, similar or equivalent elements of different embodiments have the same numerical references.

DETAILED DESCRIPTION

Figure 1:
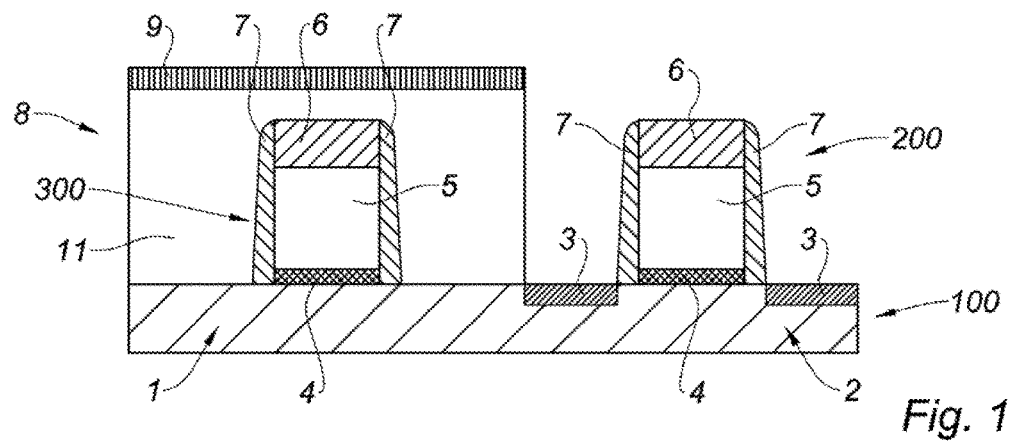
FIG. 1 illustrates a schematic sectional view of a substrate covered with a mask according to step a) of the process according to one embodiment of the invention.

As illustrated in FIG. 1 (step a), the silicon substrate 100 exhibits a first portion 1 covered with a mask 8 and a second portion 2 doped by implanted ionic species. The silicon substrate 100 is a silicon substrate, but may be constituted of any silicon-based material, such as silicon nitride, silicon oxide, SiC or SiGe. The ionic species come from arsenic, although any kind of ionic species adapted to the doping of the silicon substrate 100 may be used. They have been implanted for example with a dose of $5^E15$ at/cm$^2$ with an energy of 12 keV and at an angle of 20° so as to implant the ionic species under the gate. The second portion 2 of the shown silicon substrate 100 comprises by way of example a first MOS transistor 200 for which the doped zones 3 form the source and the drain. The transistor 200 also comprises a gate oxide 4, a gate 5 protected by a hard mask 6 and lateral spacers 7, insulating the source and the drain 3. By way of another example and without departing from the scope of the invention, the first portion 1 of the substrate 100 comprises a second transistor 300 protected by the mask 8 for not being subjected to the implantation of ionic species. This second transistor comprises a gate oxide 4, a gate 5 protected by a hard mask 6 and lateral spacers 7. It is understood in the present document that any other electronic device whose manufacture requires the implantation of ionic species in the silicon substrate 100 may be provided instead of the first MOS transistor 200. Similarly, any other device which must be protected from the implantation may be provided instead of the second transistor 300.

The silicon substrate 100 is, in particular obtained after forming a mask 8 on the first portion 1 (step a1), and in which an implantation of doping ionic species (step a2) was carried out. This mask 8 according to the invention consists of a carbon material such as a carbon resin, but any other material adapted to serve as a mask vis-à-vis an implantation of ionic species may be used. At the first portion 1, the ionic species are implanted in the mask 8, thus forming a surface layer 9 containing the ionic species. This surface layer 9 delimits a deeper underlying layer 11 in the mask 8 and which does not contain or only contains very few implanted ionic species. At the second portion 2 of the silicon substrate 100, the ionic species are implanted in the silicon substrate 100. They allow a localized doping in the substrate allowing forming functionalities for subsequent components. In the illustrated example, this doping forms the source and the drain 3 of the first transistor 200.

Figure 2:
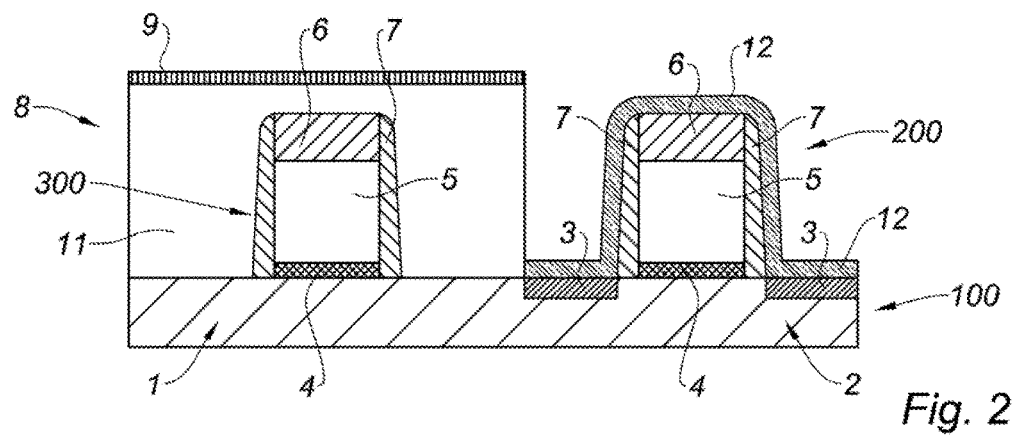
FIG. 2 illustrates a schematic sectional view of the substrate during the etching step b) of the process according to one embodiment of the invention.

As illustrated in FIG. 2 (step b), the surface layer 9 of the mask 8 is partially etched by a mixture of $SiCl_4$ and $Cl_2$ plasma. At the same time, a silicon chloride (SiClx) layer 12 is deposited on the second portion 2 of the silicon substrate 100. In the particular example including a transistor 200, the spacers 7 and the hard mask 6 are also covered with the silicon chloride layer 12. The exposure conditions to the plasma may vary according to the considered materials and thicknesses. The $SiCl_4$ flow rate may be set between 20 and 200 $cm^3$/min and preferably between 80 and 120 $cm^3$/min. The $Cl_2$ flow rate is set at a value lower than 20 $cm^3$/min and preferably between 5 to 15 $cm^3$/min. In the particular case of a silicon substrate and a carbon resin as described hereinabove, the $SiCl_4$ and $Cl_2$ flow rates are respectively set at about 95 cm 3/min and about 10 $cm^3$/min. The duration of this step may vary between about 15 seconds and 2 minutes. For example, for an application duration of the plasma over 30 seconds, the thickness of the deposited silicon chloride $SiCl_x$ layer 12 is about 5 mm, this thickness linearly increases depending on the duration. Similarly, the thickness of the etched surface layer 9 linearly increases over the time. It is for example etched on 3 nanometers in 30 seconds.

Furthermore, the etching reactor of the inductively or capacitively coupled plasma type exhibits a source set to operate at a power lower than 300 W, and preferably at a power of about 250 W. The generator of the reactor is also set to produce a bias voltage in a range comprised between 100 and 200 V and preferably comprised between 120 and 150 V and preferably in the particular case described hereinabove a voltage of about 130 V.

The used bias voltage is continuous or pulsed, allowing in the latter case improving the obtained results and limiting the damaging of the silicon substrate 100.

According to one possibility, the chlorine plasma etching according to step b) is implemented until the complete removal of the implanted surface layer 9.

Figure 3:
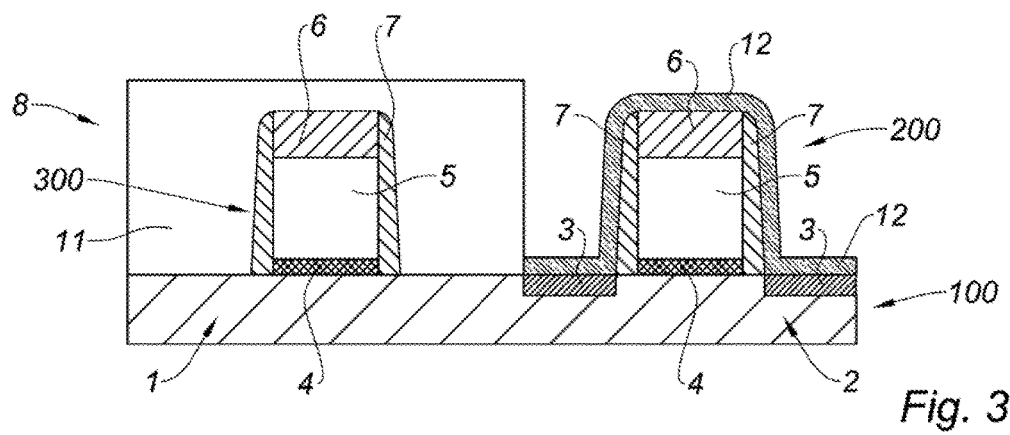
FIG. 3 illustrates a schematic sectional view of the substrate at the end of the carrying out of the etching step b1) of the process according to one embodiment of the invention.

According to another possibility, the etching of the surface layer 9 is carried out in two steps: once the thickness of the silicon chloride SiClx layer 12 deposited at step b) is sufficient to protect the underlying layers, there remains a residual surface layer portion 9. The etching plasma is then modified to accelerate the removal of the surface layer 9 (FIG. 3—step b1). A fluorine plasma is then used without changing the enclosure of the etching reactor. The applied fluorine plasma may be selected based on $CF_4$ or $SF_6$/Ar. For example, the fluorine plasma may be obtained with a flow rate of 50 $cm^3$/min of $CF_4$ for a flow rate of 500 $cm^3$/min of Ar and with a pressure of 10 mtorr and a power of 1200 W. Under these conditions and according to aforementioned example, the etching rate of the silicon chloride SiClx layer 12 is about 38 nm/min and that of the mask 8 is about 150 nm/min.

In the case of a flow rate of 35 $cm^3$/min of $SF_6$ for a flow rate of 500 $cm^3$/min of Ar with a pressure of 10 mtorr and a power of 1200 W, the etching rate of the silicon chloride SiClx layer 12 is about 56 nm/min and that of the mask 8 is about 120 nm/min.

In order to accelerate the etching rate of the residual surface layer 9 portion (step b1) and to increase the etching selectivity vis-à-vis the silicon chloride, oxygen may be added to the preceding chemistries for example with a flow rate of 200 $cm^3$/min. This oxygen spontaneously oxidizes at least partially the silicon chloride $SiCl_x$ layer 12 by forming in particular $SiO_zCly$ with y<x. Under these conditions, with an $SF_6$/Ar based plasma, the etching rate of the silicon chloride layer 12, whether or not oxidized, is about 33 nm/min and that of the mask 8 is about 407 nm/min. With a $CF_4$/Ar based plasma and oxygen, the etching rate of the silicon chloride layer 12, whether or not oxidized, is reduced to about 17 nm/min and the etching of the mask 8 approximately reaches about 560 nm/min (not illustrated).

Figure 4:
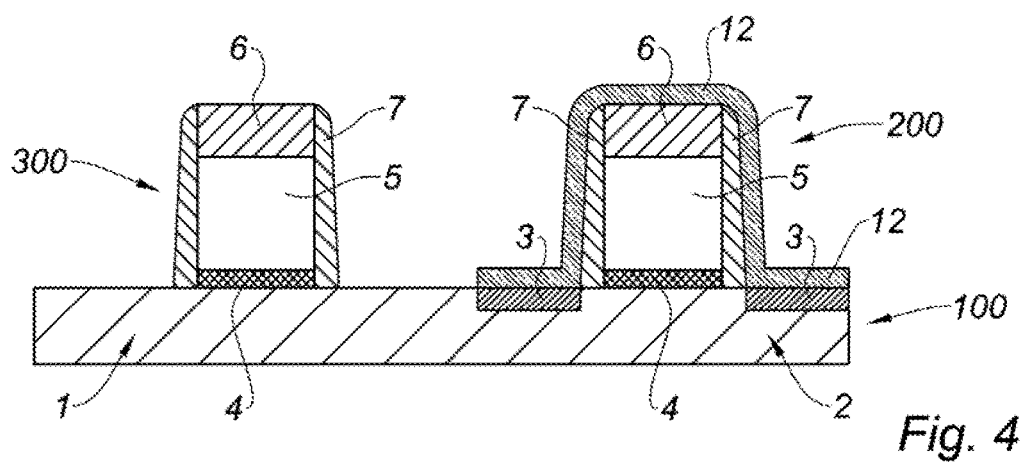
FIG. 4 illustrates a schematic sectional view of the substrate at the end of the carrying out of the etching step c) of the process according to one embodiment of the invention.

As illustrated in FIG. 4, an etching according to step c) of the process is then implemented so as to remove the underlying layer 11 corresponding to the non-implanted mask portion 8. This etching is advantageously implemented in the same etching enclosure as that used during the etching according to step b) and step b1), when the latter is implemented. The underlying layer 11 is then subjected to a $N_2/H_2$ plasma generated by microwave. This chemistry has a very high etching selectivity for the underlying layer 11 vis-à-vis the silicon chloride layer 12, whether or not oxidized, on the second portion 2. This exposure allows the complete removal of the underlying layer 11 while the silicon chloride layer 12 is partially etched. Typically, when the used bias voltage is continuous, the silicon chloride layer 12 is etched over 1 nm within 15 seconds of plasma processing. On the other hand, by using pulsed bias voltage with a frequency of 500 Hz and a duty cycle of 50%, the silicon chloride layer 12, whether or not oxidized, is not etched while the underlying layer 11 is totally etched. Typically, the pulsed bias voltage may exhibit a frequency comprised between 100 Hz and 5 kHz for a duty cycle comprised between 20 and 90% so as to improve the selectivity of the etching.

Figure 5:
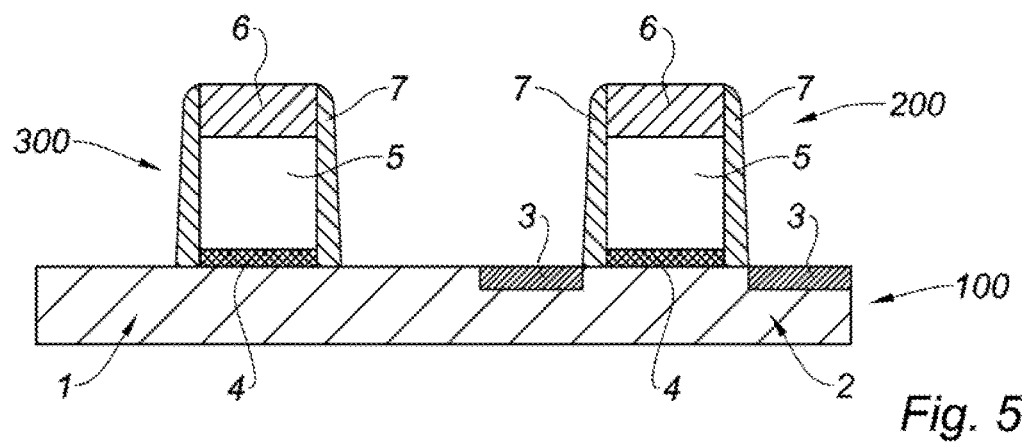
FIG. 5 illustrates a schematic sectional view of the substrate at the end of the carrying out of the etching step d) of the process according to one embodiment of the invention.

Finally, as illustrated in FIG. 5, the silicon chloride layer 12 is wet-etched in the presence of HF dilute acid. If the silicon chloride has not been at least partially oxidized when changing the reactor or a fluorine plasma comprising oxygen according to step b1), it is oxidized when placing the substrate in the air to perform the etching by HF aqueous solution. According to the residual thickness of the silicon chloride layer 12 and the desired etching time, the HF acid solution is selected with a HF acid concentration comprised between 0.1% and 1%.

Thus, the present invention provides a determining improvement to the state of the prior art by providing a selective etching process with a mask 8 on a silicon substrate 100 after implantation of dopants, which is effective, fast and accurate. This results in the accurate preservation of the doped zones 3 of a second portion 2 of the silicon substrate 100 so as the devices formed therefrom are reliable and exhibit an improved performance.

It goes without saying that the invention is not limited to the embodiments described hereinabove by way of examples but it comprises all equivalent techniques and variants of the described means as well as their combinations.

The invention claimed is:

1. A selective etching process of a carbon material mask disposed on a silicon substrate. comprises the steps of:
   a) providing a silicon substrate including a first portion covered by the carbon material mask and a second doped portion, the mask including at its surface a surface layer comprising implanted ionic species and an underlying layer free of implanted ionic species
   b) exposing the surface layer and the second portion to a $SiCl_4$ and $Cl_2$ plasma so as to deposit a silicon chloride $SiCl_x$ layer on the second portion and to etch the surface layer,
   c) etch the underlying layer so as to expose the first portion, and
   d) etch the silicon chloride $SiCl_x$ layer so as to expose the second portion.

2. The selective etching process according to claim 1, wherein the carbon material mask consists of a carbon resin that could be epoxy resin, or Spin on Carbon (SoC) and in which the silicon substrate consists of silicon, silicon nitride, silicon oxide, SiC, SiGe or any other material including silicon.

3. The selective etching process according to claim 1, wherein step b) consists in partially etching the surface layer and in which step b) further comprises a step b1) consisting in etching by fluorine plasma the portion of the residual surface layer.

4. The selective etching process according to claim 3, wherein the fluorine plasma of step b1) further comprises oxygen.

5. The selective etching process according to claim 1, wherein the plasma used in step b) is obtained by a $SiCl_4$ flow rate comprised between 20 and 200 $cm^3$/min and a $Cl_2$ flow rate lower than 20 $cm^3$/min.

6. The selective etching process according to claim 1, wherein the plasma used in step b) is obtained in an etching reactor configured to provide a power lower than 300 W.

7. The selective etching process according to claim 1, wherein step b) is carried out in an etching reactor configured to apply to the silicon substrate a bias voltage comprised between 100 V and 200 V.

8. The selective etching process according to claim 7, wherein step b) uses a pulsed bias voltage, with a frequency between 100 Hz and 5 kHz and a duty cycle between 20 and 90%.

9. The selective etching process according to claim 1, wherein step c) is carried out by a mixture of nitrogen and hydrogen plasma.

10. The selective etching process according to claim 1, wherein steps b), c) and/or b1) are carried out in the same enclosure of an etching reactor, the plasma etching reactor being an etching reactor of the capacitively or inductively coupled plasma type.

11. The selective etching process according to claim 1, wherein step d) is carried out by wet method.

12. The selective etching process according to claim 1, wherein step a) comprises beforehand a step a1) consisting in forming the mask on the first portion of the silicon substrate then a step a2) consisting in implanting ionic species in the second portion of the silicon substrate and in the mask so as to form the surface layer.

* * * * *